United States Patent
Nygren (10) Patent No.: US 8,161,344 B2
(45) Date of Patent: Apr. 17, 2012

(54) CIRCUITS AND METHODS FOR ERROR CODING DATA BLOCKS

(75) Inventor: Aaron Nygren, San Francisco, CA (US)

(73) Assignee: Qimonda AG, Munich (DE)

( * ) Notice: Subject to any disclaimer, the term of this patent is extended or adjusted under 35 U.S.C. 154(b) by 1072 days.

(21) Appl. No.: 12/046,099

(22) Filed: Mar. 11, 2008

(65) Prior Publication Data

US 2008/0244358 A1    Oct. 2, 2008

(30) Foreign Application Priority Data

Mar. 12, 2007   (DE) .................. 10 2007 011 801

(51) Int. Cl.
H03M 13/00 (2006.01)

(52) U.S. Cl. ........ 714/752; 714/718; 714/758; 714/764; 714/763

(58) Field of Classification Search .................. 714/718, 714/752, 758, 764, 763, 773
See application file for complete search history.

(56) References Cited

U.S. PATENT DOCUMENTS

| | | | |
|---|---|---|---|
| 5,961,660 A | 10/1999 | Capps, Jr. et al. | |
| 7,210,077 B2 * | 4/2007 | Brandenberger et al. | 714/708 |
| 7,900,120 B2 * | 3/2011 | Pawlowski et al. | 714/764 |
| 7,975,205 B2 * | 7/2011 | Thayer | 714/763 |
| 8,015,473 B2 * | 9/2011 | Eilert et al. | 714/773 |
| 2005/0172179 A1 * | 8/2005 | Brandenberger et al. | 714/718 |
| 2008/0072120 A1 * | 3/2008 | Radke | 714/768 |

FOREIGN PATENT DOCUMENTS

DE    103 11 428 A1    9/2004

OTHER PUBLICATIONS de Almeida, C., et al., "Efficient two-dimensional interleaving technique by use of the set partitioning concept," Electronics Letters, Mar. 14, 1996, pp. 538-539, vol. 32, No. 6.
Chen, C.-Y., et al., "Hybrid method for modular exponentiation with precomputation," Electronics Letters, Mar. 14, 1996, p. 540, vol. 32, No. 6.
Shi, Y. Q., et al., "Interleaving for Combating Bursts of Errors," IEEE Circuits and Systems Magazine, $1^{st}$ Quarter 2004, pp. 29-42, IEEE.

* cited by examiner

*Primary Examiner* — Sam Rizk

(74) *Attorney, Agent, or Firm* — John S. Economou (57) ABSTRACT

A description is given of a circuit for creating an error coding data block for a first data block, including a first error coding path adapted to create the error coding data block in accordance with a first error coding; and a second error coding path adapted to create the error coding data block in accordance with a second error coding; the error coding data block for the first data block being created optionally by the first or second error coding paths, as a function of a control indicator, and at least the first error coding path comprising a data arrangement alteration device.

51 Claims, 5 Drawing Sheets

FIG 4

CIRCUITS AND METHODS FOR ERROR CODING DATA BLOCKS

This application claims priority from German Patent Application No. 10 2007 011 801.7, which was filed on Mar. 12, 2007, and is incorporated herein in its entirety by reference.

TECHNICAL FIELD

The present invention relates to circuits, and in particular embodiments to circuits for error coding.

BACKGROUND

The demands placed upon data transmission speed of systems are continuously on the increase. In this context, a key role is played by error detection and/or error correction so as to ensure faultless data transmission and/or to further increase the system bandwidth.

In this context, errors of different types of errors may occur which are to be detected or corrected.

It is therefore desirable to be able to utilize a concept which can efficiently detect or correct errors of different types of errors.

SUMMARY OF THE INVENTION

Embodiments of the present invention provide a circuit for creating an error coding data block for a first data block. A first error coding path is adapted to create the error coding data block in accordance with a first error coding. A second error coding path is adapted to create the error coding data block in accordance with a second error coding. The error coding data block for the first data block is created optionally by the first or second error coding paths, as a function of a control indicator. At least the first error coding path includes a data arrangement alteration device.

BRIEF DESCRIPTION OF THE DRAWINGS

Embodiments of the present invention will be explained below in more detail with reference to accompanying figures.

DETAILED DESCRIPTION OF ILLUSTRATIVE EMBODIMENTS

In the present application, identical reference numerals shall be used for objects and functional units comprising identical or similar functional properties. It shall be noted in this context that, on the one hand, portions referring to objects having similar or identical functional properties are exchangeable among the descriptions of the various embodiments, unless explicitly stated otherwise. On the other hand, it shall be noted that shared use of a reference numeral for an object occurring in more than one embodiment does not necessarily mean that the object comprises identical features and properties in the various embodiments or in the embodiment in question. Thus, the use of shared or similar reference numerals does not represent any statement with regard to the specific configuration and dimensioning.

Embodiments of the present invention further provide a system comprising a processor; a memory; and the above-described circuit for creating an error coding data block for a first data block, the circuit being coupled between the processor and the memory.

In addition, embodiments of the present invention provide an apparatus for creating an error coding data block for a first data block, comprising: first means for performing a first error coding so as to create the first data block; and second means for performing a second error coding so as to create the first data block; the error coding data block for the first data block being optionally created, as a function of a control indicator, by the first means for performing a first error coding or by the second means for performing a second error coding, and at least the first means for performing a first error coding comprising a means for performing a data arrangement alteration algorithm.

Moreover, embodiments of the present invention provide a circuit for creating an error coding data block for a first data block, comprising: a data arrangement alteration device comprising an input and an output, the data arrangement alteration device being adapted to receive, at the input, a first data block comprising a given number of data in a first arrangement, and to create, on the basis of the first data block, a second data block comprising the given number of data in a second arrangement, and to output same at the output; and an error coder comprising an input and an output, the control input being coupled to the first control output of the controller, the input of the error coder being coupled to the output of the data arrangement alteration device, the error coder being adapted to create, on the basis of the second data block, a coding data block and to output same at the output of the error coder, the data arrangement alteration device further comprising a control input and being adapted to create the second data block as a function of a first control indicator in accordance with a first or second data arrangement alteration algorithm, and/or the error coder further comprising a control input and being adapted to create the error coding data block as a function of the first control indicator in accordance with a first or second error coding algorithm.

Furthermore, embodiments of the present invention provide a method of creating an error coding data block for a first data block, comprising: receiving the first data block; performing a first or second error coding so as to create the first data block; the error coding data block for the first data block being optionally created, as a function of a control indicator, by performing the first error coding or by performing the second error coding, and at least performing the first error coding comprising performing a data arrangement alteration algorithm.

Embodiments of the present invention further provide a method of creating an error coding data block for a first data block, comprising: receiving the first data block comprising a given number of data in a first arrangement; creating a second data block on the basis of the first data block, comprising the given number of data in a second arrangement; and creating the error coding data block on the basis of the second data block; the second data block being created, as a function of a first control indicator, in accordance with a first or second data arrangement alteration algorithm, and/or the error coding data block being created, as a function of the first control indicator, in accordance with a first or second error coding algorithm.

In embodiments of the present invention, various error codings may be selected for various types of errors. This enables in particular selecting the optimum error coding for each type of error or class of error types. In this context, for example, the arrangement of the data in a data block is altered, as a function of the type of error (e.g., temporal or spatial burst error), such that a subsequent application of an error coding algorithm results in a best error detection or correction possible. In embodiments of the present invention, the combination of the data arrangement alteration and the respective error coding algorithm is therefore optimized in a shared manner with regard to the type of error, or is selected as an optimum combination.

Figure 1A:
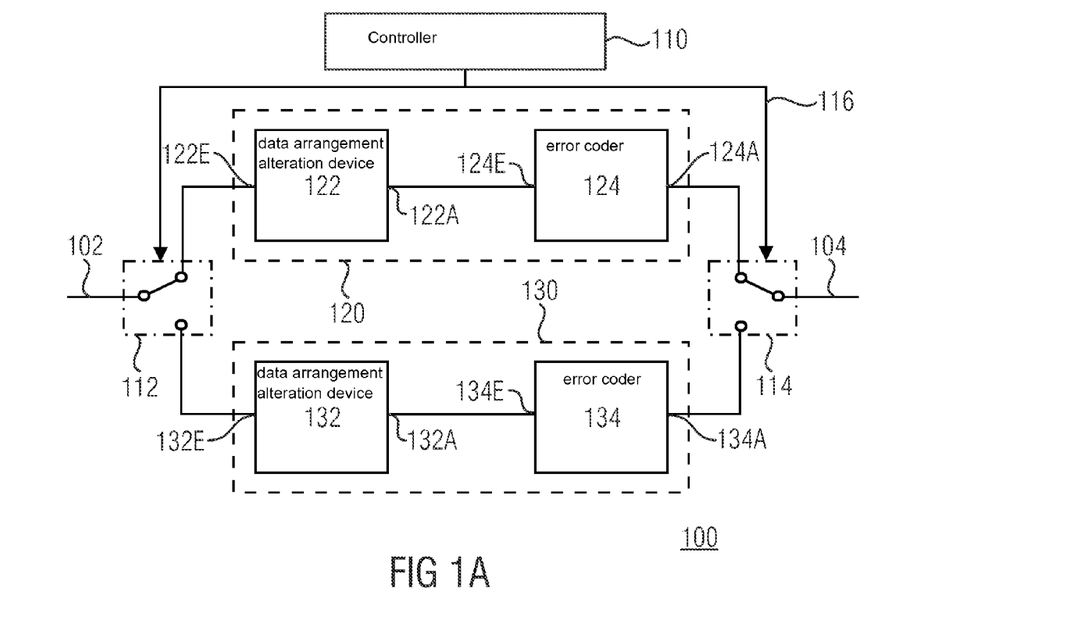
FIG. 1A shows a block diagram of an embodiment of a circuit comprising a control indicator.

FIG. 1A shows a block diagram of an embodiment of a circuit comprising a controller 110, a first error coding path 120, comprising a second error coding path 130, comprising an input 102 and an output 104. The first error coding path 120 comprises a first data arrangement alteration device 122 and a first error coder 124, and the second error coding path 130 comprises a second data arrangement alteration device 132 and a second error coder 134.

Below, the reference numerals of the respective functional units shall be used along with an E for input (entrance) and an A for output (exit) in order to designate the inputs and outputs of functional units. For example, the first data arrangement alteration device 122 comprises an input 122E and an output 122A, the first error coder 124 comprises an input 124E and an output 124A, the second data arrangement alteration device 132 comprises an input 132E and an output 132A, and the second error coder 134 comprises an input 134E and an output 134A. Via the first "switch" 112, the input 102 of the circuit 100 may optionally be connected to the input 122E of the first data arrangement alteration device 122 or to the input 132E of the second data arrangement alteration device 132. In the embodiments shown in FIG. 1A, the output 122A of the first data arrangement alteration device 122 is coupled to the input 124E of the first error coder 124, and the output 132A of the second data arrangement alteration device 132 is coupled to the input 134E of the second error coder 134. The output 124A of the first error coder, or the output 134A of the second error coder may be optionally coupled to the output 104 via the second "switch" 104. The "switches" 112, 114 are controlled via the controller 110.

A first data block comprising a given number of data in a first arrangement may be applied to the input 102 of the circuit, and the controller 110 and the "switches" 112, 114 may control whether the error coding data block to be created for the first data block shall be created via the first error coding path 120 or the second error coding path 130.

In the first error coding path 120, the first data arrangement alteration device 122 is adapted to create a second data block on the basis of the first data block, which comprises the given number of data in a second arrangement, and to output it to the first error coder 124. The latter, in turn, is adapted to create the error coding data block for the first data block on the basis of the second data block in accordance with a first error coding algorithm.

In the second error coding path 130, the second data arrangement alteration device 132 is adapted to create a second data block on the basis of the first data block in accordance with a second data arrangement alteration algorithm, the second data block comprising the given number of data in a second arrangement, and to output it to the second error coder 134. The second error coder 134 is adapted to create the error coding data block for the first data block on the basis of the second data block in accordance with a second error coding algorithm.

Since the creation of the error coding data block is created via the first error coding path 120 or the second error coding path 130, in the present description one differentiates between the first and second data arrangement alteration algorithms and the first and second error coding algorithms, but in both cases the result of the data arrangement alteration is referred to as the second data block, and the result of the error coding is referred to as an error coding data block, even the algorithms and therefore also the results differ, in order not to unnecessarily complicate understanding of the description.

The "switches" 112 and 114 may be physical or logical switches and are merely supposed to illustrate that any of the two error codings is selected for creating the error coding data block. The individual functional blocks may be implemented on separate physical units, or some of them or all of them may be implemented in one physical unit. The "switches" 112 and 114 are therefore not to be understood in a limiting sense, but generally as a possibility of changing between two alternative error codings or error coding paths, and/or to select either of them.

Accordingly, FIG. 1A may also be regarded, for example, as an illustration of a method of creating an error coding data block for a first data block, wherein one selects between a first error coding 120 and a second error coding 130 so as to create the error coding data block.

The selection is controlled, for example, via a control indicator 116, the two "switches" 112 and 114 being switched in a uniform manner, i.e., to connect, e.g., at a first signal indicator value, the input 102 and the output 104 to the first error coding path 120, and to connect the input 102 and the output 104 to the second error coding path 130 at a second control indicator value.

Further embodiments of this general concept will be described below with reference to FIGS. 1B to 1D.

Figure 1B:
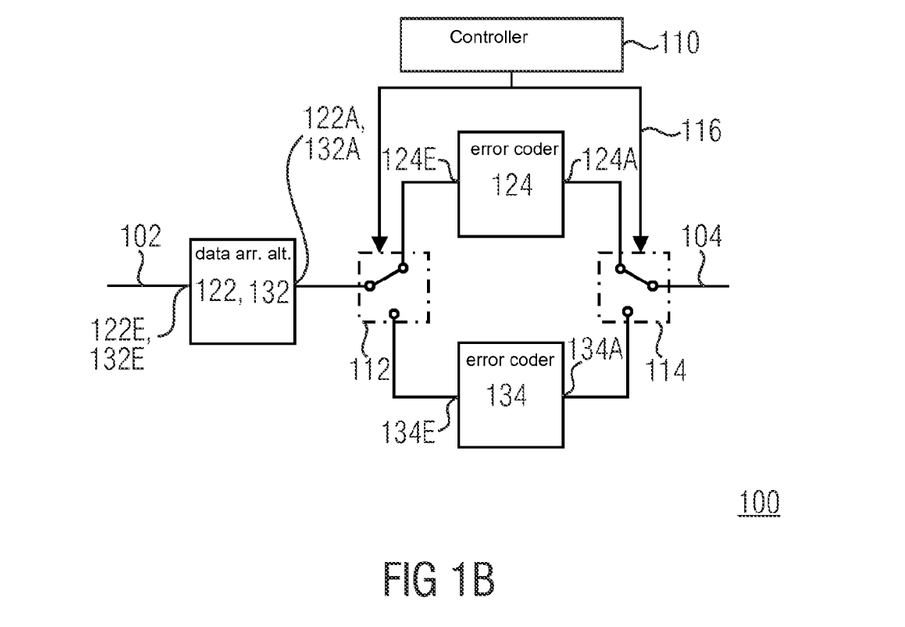
FIG. 1B shows a block diagram of a second embodiment of a circuit comprising a control indicator and comprising a shared data arrangement alteration device.

FIG. 1B shows a second embodiment of a circuit comprising a shared data arrangement alteration device 122, 132 instead of two different data arrangement alteration devices 122, 132. The controller 110 is adapted to select, via the "switches" 112, 114, the first error coder 124 or the second error coder 134 in order to create the error coding data block. In other words, the first error coding path 120 of FIG. 1A is formed, in the embodiment in accordance with FIG. 1B, of the shared data arrangement alteration device 122, 132 and the first error coder 124, and the second error coding path 130 of FIG. 1A is formed of the shared data arrangement alteration device 122, 132 and the second error coder 134.

With regard to a method of creating an error coding data block, FIG. 1B thus represents an embodiment wherein the data arrangement alteration algorithm is the same for the first and second error codings, and the first and second error codings differ in terms of the different error coding algorithms, namely the first and second error coding algorithms.

Figure 1C:
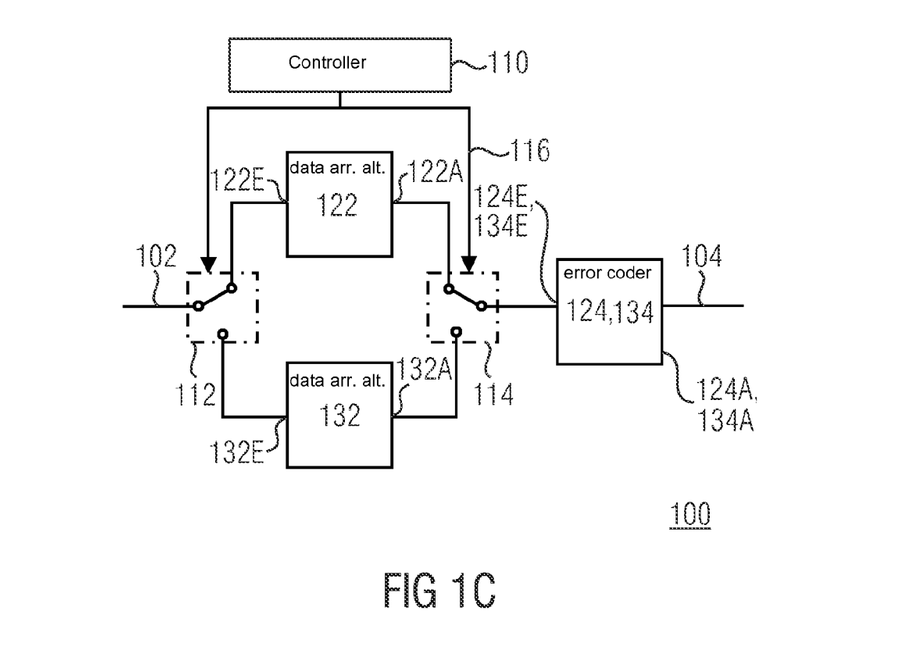
FIG. 1C shows a block diagram of a third embodiment of a circuit comprising a control indicator and a shared error coder.

FIG. 1C shows a third embodiment of the circuit comprising a shared error coder 124, 134. The controller 110 is adapted to optionally select, via the "switches" 112 and 114, on the basis of the control indicator 116, the first data arrangement alteration device 122 or the second data arrangement alteration device 132 for creating the error coding data block.

In other words, FIG. 1C shows an embodiment wherein the first error coding path 120 in accordance with FIG. 1A is formed of a first data arrangement alteration device 122 and the shared error coder 124, 134, and the second error coding path 130 is formed of the second data arrangement alteration device 132 and the shared error coder 124, 134.

With regard to the method for generating an error coding data block, FIG. 1C thus shows an embodiment wherein the first and second error codings differ in terms of different data arrangement alteration algorithms, namely the first and second data arrangement alteration algorithms, but utilize the same error coding algorithm.

Figure 1D:
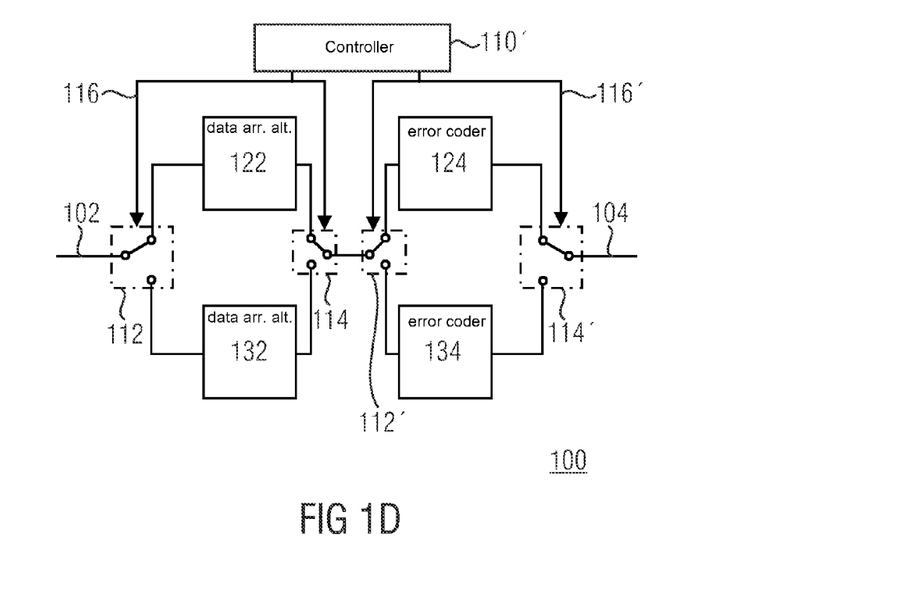
FIG. 1D shows a block diagram of a fourth embodiment comprising two control indicators so as to be able to interconnect data arrangement alteration devices and error coders in a flexible manner.

FIG. 1D shows a fourth embodiment of a circuit wherein the selection of the error coding is based on a first control indicator 116 and a second control indicator 116'. On the basis of the first control indicator 116, the first data arrangement alteration device or the second data arrangement alteration device 132 is optionally selected by means of the "switches" 112 and 114, and on the basis of the second control indicator 116', the first error coder 124 or the second error coder 134 is selected by means of the "switches" 112' and 114'. In this manner, a maximum amount of flexibility is achieved, so that various data arrangement alteration devices and error coders may be arbitrarily interconnected so as to be able to realize an optimum combination of a specific data arrangement alteration algorithm and a specific error coding algorithm, for example, as a function of the type of error.

With regard to a method of creating an error coding data block, FIG. 1D thus describes an embodiment wherein a first or second error coding is implemented in a flexible manner by combining a first or second data arrangement alteration algorithm with a first or second error coding algorithm.

Alternative embodiments of the above-described circuits may also comprise more than two data arrangement alteration devices or algorithms and/or more than two error coders or error coding algorithms, which are combined as was set forth above so as to select optimum combinations for specific types of error. The number of the various data arrangement alteration devices or algorithms and the number of error coders or error coding algorithms may differ. In particular in this case, embodiments of the circuit as are shown in FIGS. 1B, 1C and/or 1D, or combinations of the same may be advantageous in order to apply, for example, as a function on the type of error, specific data arrangement alteration algorithms to these types of error in combination with the same error coding algorithm.

Figure 1E:
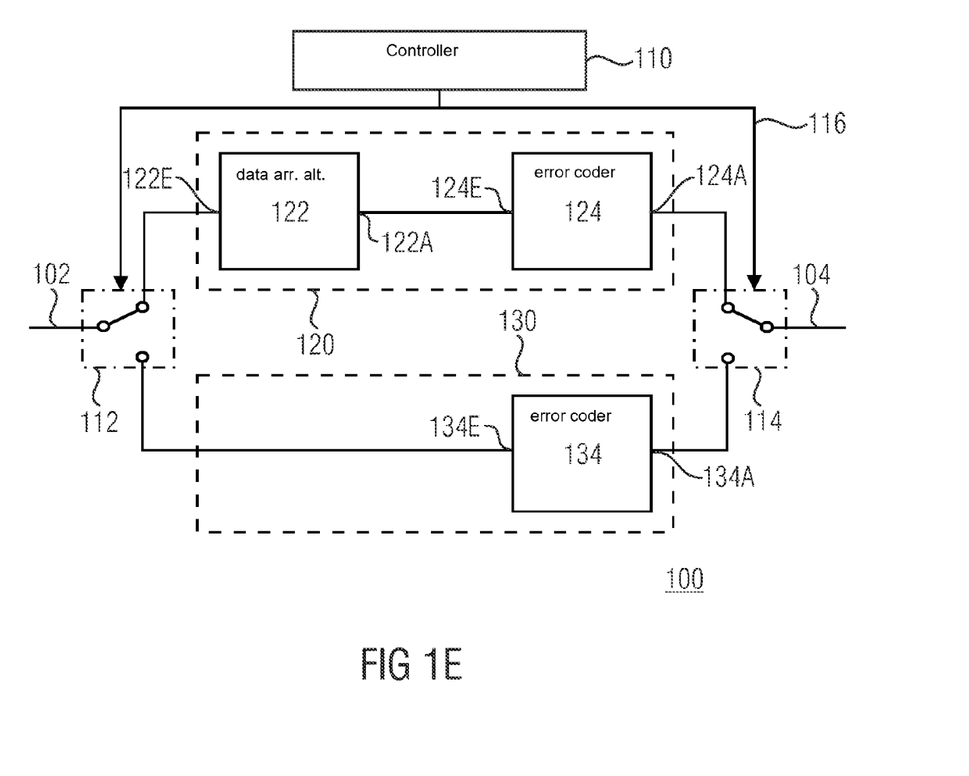
FIG. 1E shows a block diagram of a further embodiment of a circuit comprising a control indicator.

FIG. 1E shows a further embodiment of a circuit for creating an error coding data block for a first data block, the embodiment being similar to that of FIG. 1A. The embodiment in FIG. 1E differs from the embodiment of FIG. 1A in that the second error coding path 130 comprises no data arrangement alteration device. Such embodiments may be employed, for example, when the data in the first data block are present in an arrangement which may already be advantageously used for the second error coding, while for the first error coding path 120, the data received at the input 102, or the first data block, are placed in a different data arrangement which is advantageous for the first error coding.

Figure 2:
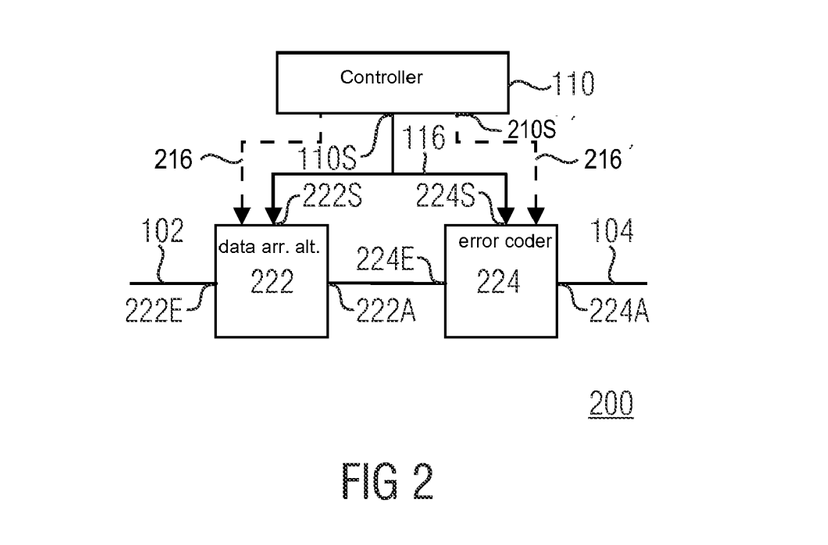
FIG. 2 shows a block diagram of a fifth embodiment of a circuit comprising a control, a data arrangement alteration device, and an error coder.

FIG. 2 shows a fifth embodiment of a circuit for creating an error coding data block for a first data block comprising a controller 110, a data arrangement alteration device 222 and an error coder 224. The data arrangement alteration device 222 comprises an input 222E, an output 222A and a control input 222S, and the error coder 224 comprises an input 224E, an output 224A and a control input 224S. The controller 110 comprises a first control output 110S. The first control output 110S of the controller 110 is coupled to the control input 222S of the data arrangement alteration device 222 and to the control input 224S of the error coder 224, the input 102 of the circuit 200 is coupled to the input 222E of the data arrangement alteration device 222, the output of the data arrangement alteration device 222 is coupled to the input 224E of the error coder 224, and the output 224A of the error coder 224 is coupled to the output 104 of the circuit 200.

The data arrangement alteration device 222 is adapted to receive, at the input 222E or 102, a first data block comprising a given number of data in the first arrangement, and to generate, on the basis of the first data block, a second data block comprising the given number of data in a second arrangement, and to output same at the output 222A, the second data block being generated as a function of the first control indicator 116 in accordance with a first or second data arrangement alteration algorithm. In other words, as a function of the first control indicator 116, the data arrangement alteration device 222 is adapted to perform a first or second data arrangement alteration algorithm.

The error coder 224 is adapted to generate the coding data block on the basis of the second data block and to output same at the output of the error coder 224A or 104, the error data block being created as a function of the first control indicator 116 in accordance with a first or second error coding algorithm. In other words, the error coder 224 is adapted to perform a first or second error coding algorithm as a function of the first control indicator 116.

In this context, in an embodiment in accordance with FIG. 2, only that error coder 224 which is coupled to the control output 116 may comprise a control input 224S and may be adapted to perform a first or second error coding algorithm as a function of the value of the control indicator, and the data arrangement alteration device 222 may be adapted to perform a fixed data arrangement alteration algorithm, similarly to what was described in FIG. 1B.

In another embodiment, the circuit may be configured such that only the data arrangement alteration device 222 comprises a control input 222S coupled to the control output 110S of the controller 110 so as to perform a first or second data arrangement alteration algorithm as a function of a value of the control indicator 116, while the error coding device 224 performs a fixed, or shared, error coding algorithm, as was already described above with reference to FIG. 1C.

In a further embodiment, the data arrangement alteration device 222 comprises a control input 222S, and the error coder 224 comprises a control input 224S, which are coupled to the control output 110S of the controller 110. In such an example, the data arrangement alteration device 222 may be adapted to perform a first data arrangement alteration algorithm at a first value of the control indicator 116, and the error coder 224 may be adapted to perform a first error coding algorithm at a first value of the control indicator 116, and further the data arrangement alteration device 222 may be adapted to perform a second data arrangement alteration algorithm at a second value of the control indicator 116, and the error coder 224 may be adapted to perform a second error coding algorithm when the control indicator comprises a second value. Such an embodiment corresponds to an embodiment as was described with reference to FIG. 1A.

FIG. 2 shows a further embodiment (see dashed lines) comprising a first control indicator 216 and a second control indicator 216', the control input 222S of the data arrangement alteration device 222 being coupled to a first control input so as to perform a first or second data arrangement alteration algorithm on the basis of the first control indicator 216, and the control input 224S of the error coder 224 being coupled to the second control output 210S' of the controller 110 so as to perform a first or second error coding algorithm as a function of the second control indicator 216', similarly to what has already been described with reference to FIG. 1D.

In this context, the first data arrangement alteration device may be adapted to perform the first and second data arrangement alteration algorithms on two different hardware platforms, or on the same hardware, in which case this hardware is configured, for example, to execute two or more different software programs or microprograms in order to perform the different data arrangement alteration algorithms. Accordingly, the error coder 224 may also be adapted to perform the first and second error coding algorithms on two different hardware units which are selected as is depicted in FIGS. 1A-1D, or on the same hardware unit which is adapted to execute two or more different software programs or micro programs, for example, which would correspond to the "logical switch" discussed with reference to FIGS. 1A-1D.

Figure 3:
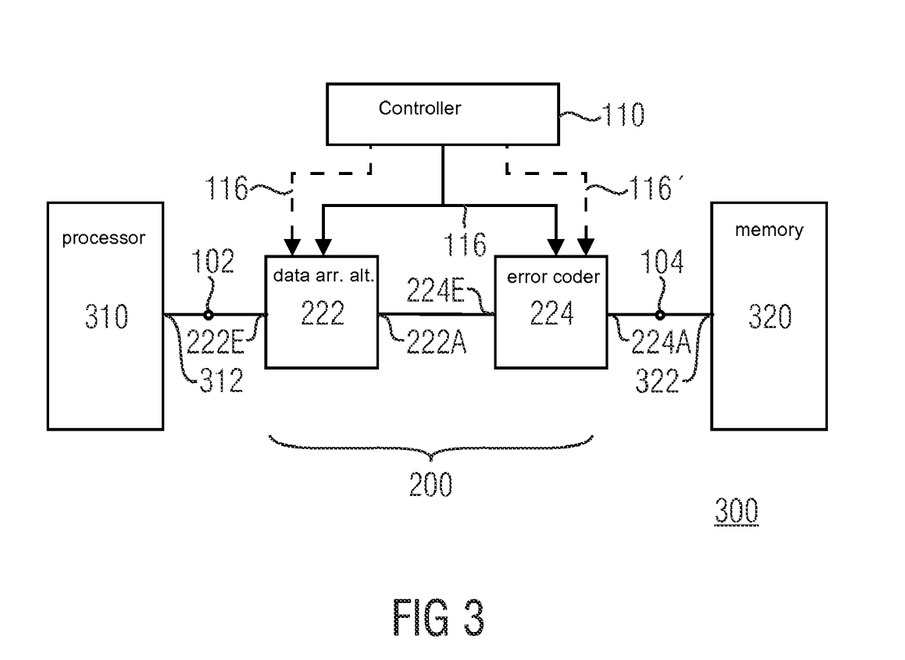
FIG. 3 shows a block diagram of a circuit as an interface device between a memory control and a memory chip.

FIG. 3 shows an embodiment of a system comprising a processor 310, a memory 320, and the circuit 200 in accordance with FIG. 2, which is located, or coupled, between the processor 310 and the memory 320. The processor may be a memory controller, for example. An output 312 of the processor 310 is connected to the input 102 of the circuit, or to the input 222E of the data arrangement alteration device 222, while an input 322 of the memory 320 is connected to the output 104 of the circuit, or to the output 224A of the error coder 224. The controller 110 may be a mode register of the system, for example, which contains, e.g., information on the activation of a burst mode and/or the burst length, for example, in the form of bits which are set or not set, so that these bits may be employed, for example, as control indicators so as to select the respective error coding as a function of the operating mode of the system.

Figure 4:
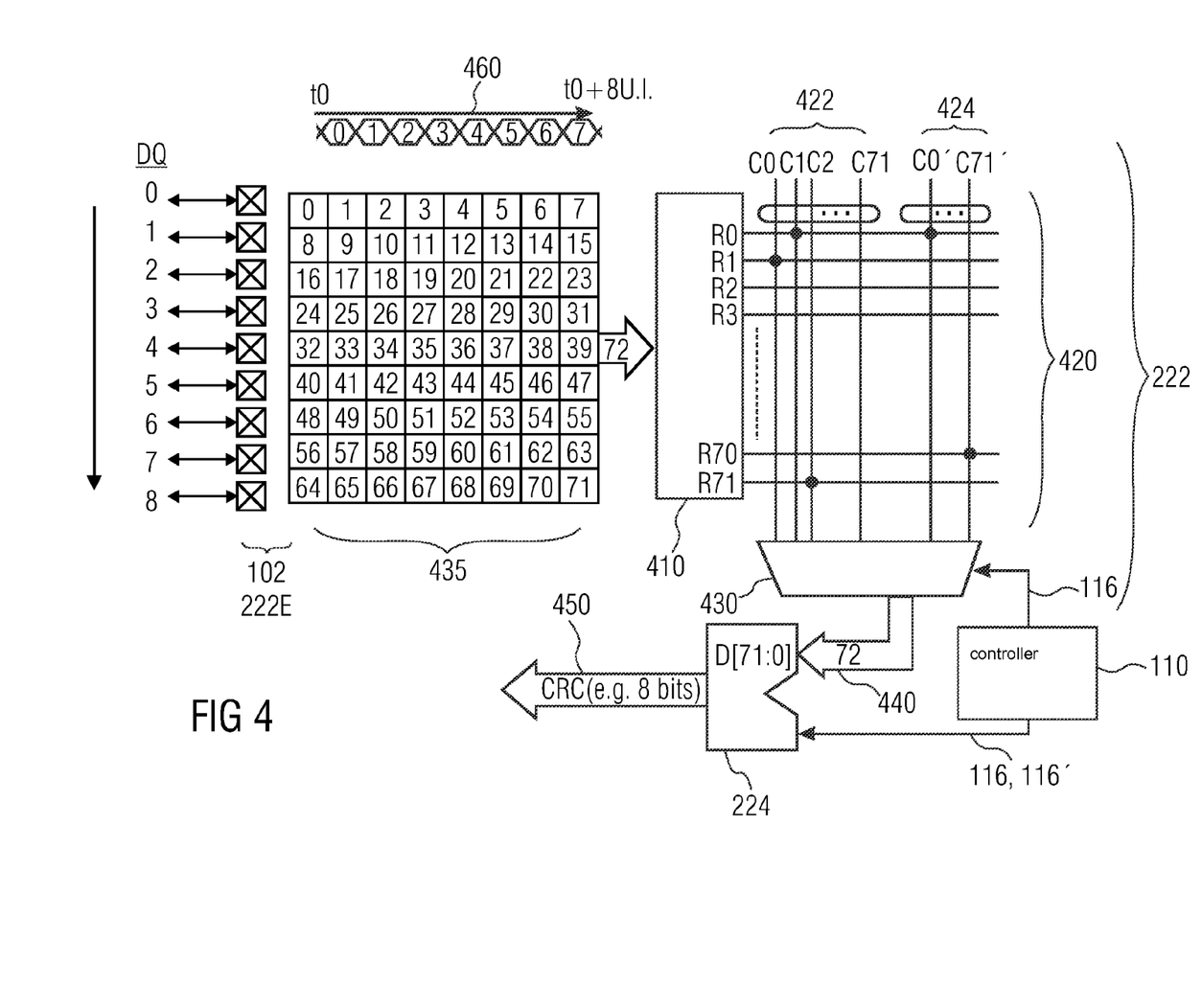
FIG. 4 shows a block diagram of an embodiment of a circuit as a memory interface device comprising a parallel input, a deserializer, a programmable logical unit, an error coder, and a mode register.

FIG. 4 shows a further embodiment of a circuit, wherein the circuit is a memory interface device between, e.g., a processor and a memory, or a memory chip, as was described above with reference to FIG. 3.

Embodiments of the circuit, of the system and of the method for memory applications will be described below.

In upcoming high-speed DRAMs (dynamic random access memory), the utilization of error detection coding (EDC) and possibly of error correction coding (ECC) has, or have, become key features. There are at least two main reasons for using at least error detection coding in DRAM interfaces. One reason is that new applications such as high-speed applications employ graphic memories, e.g., GDRAMs (graphic DRAM), for instruction sets instead of frame-orientated buffer memories (frame buffers), which necessitates that data transmission is very secure. In an application which is mainly graphics-oriented, correction of only a few bits is usually not critical and will result in a "blip" in the graphics which goes unnoticed. On the other hand, a bit error in a code or in an instruction set may cause the system to "collapse", i.e., to no longer function. A second reason is that the use of error detection and correction codes enables shifting of the system bandwidth toward higher limits while ensuring at the same time that the error detection coding or error correction coding will enable the system to continue to run without any problems even though one or several errors have occurred in the data transmission.

For any type of error detection coding or error correction coding, the proper characteristics must be selected:
1. to select the best algorithm from among the plurality of potential algorithms, such as repetition codes, polynomial-based codes such as the CRC code (cyclic redundancy check), simple or multi-dimensional parity codes, Hamming distance-based codes, etc.;
2. in the case of polynomial-based codes, to select the best polynomial; and
3. to select that arrangement for the data processing which will influence which type of errors may be detected and/or corrected best.

In conventional DRAM interfaces, no error detection codes or error correction codes are employed. Embodiments of the present invention address, in particular the second and third above-mentioned aspects. A simple solution would be, for example, to employ a fixed value such as a fixed polynomial for CRC coding and a fixed data processing order on the basis of the current best guess. For DRAM interfaces, CRC codes present themselves as the best choice among the error detection and correction codes, since the data transmission is burst-oriented, or a burst-type transmission, and CRC codes comprise very good burst error coverage. The "burst orientation" for a parallel DRAM interface may be both in the temporal and in the spatial directions.

It is therefore difficult to decide, for example, which polynomials are to be employed, and in which order data are to be processed using the polynomial in order to achieve the best error coverage possible for a DRAM system.

Since the high-speed DRAM systems continuously make progress and keep changing, the types of error patterns or error types in the system also change. In addition, the error patterns for the same DRAM change as a function of the system environment and the application. It is therefore impossible to select an optimum polynomial and an optimum data sequence to cover all cases.

Embodiments of the circuit may enable flexible selection of, for example, the CRC polynomial and the data processing sequence.

Embodiments of the circuit utilize the DRAM mode register and/or programmable fuses which may be programmed electrically or on a laser base, and/or metal mask options in order to design
1. the CRC polynomial to be programmable, and
2. the sequence of the data processing to be flexible.

A relatively simple embodiment is to use two different polynomials and to employ data processing in one of two directions (spatial or temporal), or perform it in one of two sequences. FIG. 4 shows such an embodiment.

FIG. 4 shows an embodiment of an inventive circuit as a DRAM interface comprising a parallel input 102, a deserializer 410, a programmable logical unit 420, a multiplexer 430, the controller 110 in the form of the mode register of the DRAM, and an error coder 224 in the form of a CRC logic. The deserializer 410, the programmable logical unit 420 and the multiplexer 430 form a data arrangement alteration device 222. The parallel input 102, or the parallel interface 102, is adapted to receive nine bits (DQ0-DQ8) simultaneously. The deserializer 410 is adapted to receive several nine-bits data words (e.g., first nine-bits data word: 0, 8, 16, . . . 64; second nine-bits data word: 1, 9, 17, . . . , 65, etc.) via several clock pulses and to arrange them in parallel. In the example shown in FIG. 4, the deserializer 410 receives in eight clock pulses (t0–t0+8 U.I.) eight data words comprising nine bits each, i.e., 72 bits in total. With reference to FIGS. 1A-1E, 2 and 3, the matrix arrangement, designated by reference numeral 435, of the bits 0-71 received, corresponds to the first arrangement which in this example comprises a temporal and a spatial component. As is depicted in FIG. 4, the deserializer 410 is adapted to convert the first data block to a parallel representation, so that each bit of the matrix 435, or of the first data block 435, is arranged in a row R0-R71, or is applied to a row line R0-R71, the type of the deserialization being dependent on the respective deserializer.

The programmable logical unit 420 is divided up into two areas, namely into a first subarea 422 comprising the column lines C0-C71, and into a second subarea 424 comprising the column lines C0'-C71'. The programmable logical unit 420 is programmed such that in the first subarea 422, each row R0-R71 is connected to exactly one column C0-C71, and in the second subarea 424, each row R0-R71 in turn is connected to exactly one column, or column line, C0'-C71'. Thus, any change in the data sequence may be achieved, via this programmable logical unit 420, at the column line outputs connected to the multiplexer 430. In other words, the first subarea 422 defines a first data sequence, or a first data arrangement alteration algorithm, while the second subarea 424 defines a second data sequence, or a second data arrangement alteration algorithm. The column lines C0-C71 of the first subarea 422 or the column line C0'-C71' of the second subarea 424 are optionally selected via the multiplexer 430. The selection is performed, for example, as a function of the control bits or control indicators of the mode register, as is shown by reference numeral 116 and the arrow extending from the controller 110 to the multiplexer 430. A data word 440 of a word width of 72 bits is output at the output of the multiplexer 430, the data word 440 corresponding, with reference to FIGS. 1A-1D, 2 and 3, to the second data block 440 which comprises the same data, namely the 72 bits of the first data block 435 in a second arrangement which is different from the first arrangement of the first data block.

In other words, the type of deserialization by the deserializer 410, and the change of sequence performed by the first subarea 422 or the second subarea 424 realize the first and/or second data arrangement alteration algorithms, while the multiplexer 430 selects, on the basis of the control indicator 116, the first or second data arrangement alteration algorithm or the respective data arrangement alteration device.

The second data block is passed on to the error coder 224, where the second data block will create, as a function of the control bits, or the control indicators 116, in accordance with a first or second CRC code, the error coding data block for the first data block 435, as is depicted in FIG. 4 by reference numeral 450, the error coding data block in this case comprising eight bits.

In a further embodiment, the first control indicator 116 is formed by a first bit or first combination of control bits of the mode register, while the second control indicator 116' is formed by a second, different bit or by a different combination of bits of the mode register. Accordingly, such an embodiment comprising first and second control indicators will enable, as was described before, an even more flexible selection or combination of data arrangement alteration algorithms and error coding algorithms.

In other words, the control bits in the example in accordance with FIG. 4 select a first data sequence or a second data sequence and a polynomial in the CRC block. Two potential forms of the data arrangement are as follows:

1. a second data arrangement 440 optimized to cover burst errors in the temporal direction:
   e.g., 0-7; 8-15; 16-23; . . . ; 64-71

2. a second data arrangement 440 optimized to cover burst errors in the spatial direction:
   e.g., 0, 8, 16, 24, 32, 40, 48, 56, 64; 1, 9, 17, 25, 33, 41, 49, 57, 65; . . . ; 7, 15, 23, 31, 39, 47, 55, 63, 71.

In one embodiment, the first or second subareas may be adapted to output the sequence of the data, as are present at rows R0 to R71, in an unchanged manner, e.g., at the column outputs C0 to C71. In other words, R0 is linked C0, R1 to C1, . . . , and R71 to C71.

Any combination of data sequences is possible, and a flexible implementation is, as is shown in FIG. 4, the utilization of a programmable logical unit so as to enable any combination of sequences possible. Examples of programmable logical units are PLA (programmable logic array), PAL (programmable array logic) or PLE (programmable logic element). Alternative realizations of the grid 420 are, for example, fixed connections of metal or other conducting materials.

The selection of the polynomial may be implemented in various manners. A simple method is to select a path through two different logic blocks, each logic block representing a different polynomial. This method is not efficient in terms of surface area, but it is possible. Those skilled in the art have known other "more intelligent", or more surface area-efficient ways of selecting polynomials in a flexible manner, which is why this topic shall not be addressed in more detail here. What is essential for embodiments of the invention is that, for example, the polynomial may be programmed for the DRAM.

As an alternative to utilizing the mode register, any other controller may also be used.

Alternative embodiments of the data arrangement alteration device 222 comprise, for example, a matrix 420 comprising more than two subareas 422 and 424, and a multiplexer 430 which may select from among more than one subarea.

Any implementations which may change an arrangement of data such that these data will be processed in an optimum manner for a subsequent error detection or correction algorithm may be considered as a potential data arrangement alteration device 222.

An alternative embodiment of a data arrangement alteration device as may be employed, for example, in the circuit in accordance with FIG. 4 is a memory matrix which stores the values in successive columns in that order in which they are received, but wherein these will then not be read out again, in a column-by-column manner, in the same order, but will be read out, for example, in a row-by-row manner.

In the following, an example is given of two different data arrangement alteration algorithms which change the arrangement of the data of the first data block such that a temporal burst error and/or a spatial burst error may be discovered by a CRC code.

Burst errors, also referred to as block errors, are errors which occur as a function of others. An error burst is characterized by a contiguous sequence of erroneous bits or generally of erroneous symbols, wherein the first and the last bits are erroneous. Well-selected CRC polynomials can detect all one-bit errors, any odd number of corrupted bits as well as all burst errors of a length of $\leq r$, r being the degree of the CRC polynomial. In addition, all errors (that is, also independent four-bits, six-bits, eight-bits errors, etc.), the polynomial representation of which has a smaller degree than the CRC polynomial, are detected. For example, in the example depicted in FIG. 4, an eighth-degree CRC generator polynomial is employed in order to create the eight CRC bits. Accordingly, the circuit comprising a well-selected CRC polynomial may detect errors of up to eight bits if they are present as a contiguous burst of errors in the second arrangement 440.

A temporal burst error wherein, for example, the bits bearing the numbers 24-27 in the first data block 435 (see FIG. 4) are all incorrect, may be detected, for example, by a corresponding subarea 422 which arranges the bits bearing the numbers 24-27 in the second data block 440 in such a manner that they immediately succeed one another and will be discovered if a corresponding eighth-degree polynomial is applied. If these erroneous bits were present in a distributed manner, they might not be detected by the same polynomial.

The same applies to a spatial burst error. If, for example, the bits bearing the numbers 16, 24, 32 and 40 (see FIG. 4) are all erroneous, they can be arranged, by a suitably configured second subarea 424, such that they immediately succeed one another in the second data block 440 and thus will be detected by means of the CRC polynomial. In the event that the bits bearing the numbers 16, 24, 32, and 40 are present in a distributed manner in the second data block 440, the detection of these errors by means of the CRC polynomial is rather unlikely.

Using embodiments of the present circuit, however, combinations of temporal and spatial burst errors may also be discovered. Supposing the bits bearing the numbers 33, 34, 41 and 42 of the first data block 435 (see FIG. 4) are all erroneous, they may be arranged by a suitable change in the arrangement in the data arrangement alteration device 222 in the second data block 440 such that with regard to determining the CRC polynomial, they will succeed one another and will be processed, so that this combined temporal/spatial burst error will be detected by means of a suitable CRC code.

As was explained above, the type of the error patterns depends, for example, on DRAM systems, the memory chip, the system environment, and the application or the mode in which the memory or the memory system is operated. In addition to the selection of the CRC polynomials, the selection of the respective data arrangement alteration devices and the data arrangement alteration algorithms is therefore decisive for the error detection rate.

Error types or error patterns may be determined, for example, via statistical models, simulations and/or actual measurements or tests, so as to determine, on the basis thereof, the optimum combinations of data arrangement alteration algorithms and error coding algorithms.

However, as was described above, embodiments of the circuit are not limited to CRC error codes, but may be employed with any other error detection and/or error correction codes wherein the error detection or error correction rates may be increased by a change in the arrangement of the data, the change being adjusted to the error patterns and the error code.

The embodiment in accordance with FIG. 4 depicts a scenario wherein nine-bits words are read in over eight time pulses (0-7), and in another arrangement 440 are passed to the error coder 224. In a further scenario, the burst length may be set, for example, to four time pulses to 0-3 via a burst mode controller, so that embodiments of the present invention are selected to provide, for example, a further subarea of the matrix 420 for this mode, and to control the multiplexer 430, via the mode register 110, such that this subarea will be read out, so that, for example, only 36 of the 72 bits will be occupied with processable data, and so that possibly the polynomial in the error coder 224 will be selected accordingly.

Alternative embodiments of the circuit comprise a serial input, or a serial interface, a parallel input, or a parallel interface in order to receive several data, for example bits, at the same time, and/or to receive several bits or data words over several clock pulses or a relatively long time interval. A piece of data may be, for example, a bit, and a data word may consist of several bits, for example. It is possible for a data word to be formed of several bits which are received in a serial manner, i.e., successive in time, or to be formed by several bits which are received at the same time (parallel interface). In this context, what is meant by data block is a serial data word, a parallel data word, or a serial sequence of parallel data words, as is depicted, for example, by reference numeral 435 in FIG. 4. Embodiments of the data arrangement alteration device 222 are adapted to change any of these types of data blocks or all of them in accordance with at least one data arrangement alteration algorithm so as to optimize error detection, or at least to improve error detection as compared to an approach without any change in the data arrangement, by means of the subsequent error coding algorithms.

The respective illustrations shall also apply to embodiments as were discussed in FIGS. 1A-1E.

FIG. 3 shows an embodiment of a system comprising a processor 310, a memory or memory chip 320, and an embodiment of a circuit 200, the circuit being arranged, or coupled, between the processor 310 and the memory 320.

The processor 310 may be a memory controller, for example.

By way of example, a potential writing operation and a potential reading operation will be described below without limiting embodiments of any of the above-mentioned systems to this implementation.

For storing the first data block, the processor 310 applies the first data block to the input 102 or the input 222E of the data arrangement alteration device 222. As a function of the value of the first control indicator 116 in the mode register 110, the data arrangement alteration device 222 selects, for example, the first data arrangement alteration algorithm so as to create the second data block on the basis of the first data block. As a function of the value, e.g., of the first control indicator 116, the error coder 224 selects an error coding algorithm, e.g. the first error coding algorithm, so as to create the error coding data block for the first data block and to output it at the output 224A of the error coder 224 or at the output 104 to the memory input 322 of the memory 320. The memory 320 is adapted to store the information of the first data block along with the error code data block, so that during readout of the information of the first data block, its correctness may be verified by evaluating the error coding data block. In this context, the information of the first data block may be applied to the memory 320, for example in the form of the first data block, e.g., by means of a direct connection between the processor 310 and the memory 320, or, for example, in the form of the second data block comprising the second, or modified, data arrangement.

For readout of the information of the first data block on the part of the processor 310, for example, the information of the first data block is read out, in the form of the first data block, along with the error coding data block from the memory 320, and the first data block is processed, similar to the writing operation, in accordance with a circuit as is depicted, for example, in FIG. 2, i.e., is first of all converted, in a data arrangement alteration unit, to a second data block comprising a second data arrangement, so as to then perform the same error coding algorithm as was applied for the writing operation, so as to create an error coding data block on the basis of the first data block stored. This error coding data block is then compared, for example, to the error coding data block stored so as to verify the correctness of the first data block read out.

In the second embodiment, wherein the information of the first data block is stored in the memory in the form of the second data block, the second data block is read out along with the error coding data block in a reading operation, and the second data block of an error coding is performed in accordance with the same error coding algorithm, as was already applied in the writing operation, so as to create a second error coding data block. This second error coding data block is compared to the stored, or first, error coding data block so as to ascertain whether the second data block was read out correctly, correct readout being concluded if the first and second error coding data blocks match. To restore the data arrangement of the first, original data block 435, the data arrangement alteration algorithm which is inverse to the data arrangement alteration algorithm employed for the writing operation is performed.

The circuit may be a separate circuit or may be an integral part of the processor 310 or of the memory or memory chip 320. Irrespective of this, the controller 110, e.g., the mode register, may be an integral part of the processor, of the circuit, or of the memory, it being typical in a memory application for the memory controller to determine or control the operating mode, i.e. the content of the mode register.

In a further embodiment, the circuit is part of a memory module comprising the circuit and one or more memory chips which are applied, for example, to a substrate of the memory module.

The error coding for the memory controller may be "transparent", i.e., the memory controller does not "notice" that an error coding and an error verification are being performed, but for a writing operation provides the first data block without error coding, as in conventional systems, and reads out the first data block in a reading operation, as in conventional systems. The error coding and the error verification are performed, for example, on the memory module.

The memory module may be adapted to read out the control indicator from the mode register of the memory controller so as to then perform, in the writing operation, the error coding, and to perform, in a reading operation, the verification of the correctness, or the error correction, in a self-sufficient manner, i.e., without any further control on the part of the memory controller.

Instead of a circuit in accordance with FIG. 2, embodiments of the circuit in accordance with any of FIGS. 1A-1E may also be used in a system. The description with regard to the embodiments of exemplary reading and writing devices shall apply accordingly.

The circuits described in the previous embodiments may comprise discrete components or may be integrated circuits.

Depending on the conditions, the embodiments of the inventive methods may be implemented in hardware or in software. The implementation may be on a digital storage medium, in particular a disc, CD or DVD having electronically readable control signals which may cooperate with a programmable computer system such that any of the embodiments of the inventive methods is/are performed. Generally, the embodiments of the present invention thus also consist in software program products or computer program products or in a program product having a program code, stored on a machine-readable carrier, for performing any of the embodiments of the inventive methods when any of the software program products run on a computer or on a processor. In other words, an embodiment of the present invention may thus be realized as a computer program or a software program or a program having a program code for performing an embodiment of an inventive method when the program runs on a processor.

In this context, the processor may be formed by a computer, a chip card, a digital signal processor or any other integrated circuit.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

What is claimed is:

1. A circuit for creating an error coding data block for a first data block, the circuit comprising
a first error coding path adapted to selectively create a first error coding data block in accordance with a first error coding; and
a second error coding path adapted to selectively create a second error coding data block in accordance with a second error coding;
the first error coding path and the second error coding path being selected as a function of a control indicator, and at least the first error coding path comprising a data arrangement alteration device.

2. The circuit as claimed in claim 1, wherein the first error coding path and the second error coding path are adapted to perform the same data arrangement alteration algorithm for the first and second error codings.

3. The circuit as claimed in claim 2, wherein the first error coding path and the second error coding path comprise a data arrangement alteration device shared by both error coding paths.

4. The circuit as claimed in claim 1, wherein the first error coding path and the second error coding path are adapted to perform the same error coding algorithm for the first and second error codings.

5. The circuit as claimed in claim 4, wherein the first error coding path and the second error coding path comprise an error coding device shared by both error coding paths.

6. The circuit as claimed in claim 1, wherein the first error coding path comprises a first data arrangement alteration device and a first error coder and the second error coding path comprises a second data arrangement alteration device and a second error coder;
the first data arrangement alteration device being adapted to perform a first data arrangement alteration algorithm, and the second data arrangement alteration device being adapted to perform a second data arrangement alteration algorithm which is different from the first data arrangement alteration algorithm; and
the first error coder being adapted to perform a first error coding algorithm, and the second error coder being adapted to perform a second error coding algorithm which is different from the first one.

7. The circuit as claimed in claim 1, wherein the error coding data block for the first data block is selectively created by the first or second error coding paths as a function of the control indicator and a second control indicator.

8. The circuit as claimed in claim 1, wherein the data arrangement alteration device is adapted to create a second data block, comprising a given number of data in a second arrangement, on the basis of the first data block comprising the given number of data in a first arrangement, in accordance with a data arrangement alteration algorithm.

9. The circuit as claimed in claim 1, wherein an input of the circuit is a parallel input which may receive several data at the same time.

10. The circuit as claimed in claim 1, wherein an error coding device is adapted to perform an error detection or error correction algorithm as an error coding algorithm.

11. The circuit as claimed in claim 1, wherein an error coding device is adapted to perform a cyclic redundancy code algorithm as an error coding algorithm.

12. The circuit as claimed in claim 1, wherein the control indicator is dependent on an operating mode.

13. The circuit as claimed in claim 1, which is an integrated circuit.

14. The circuit as claimed in claim 1, wherein the circuit is a graphic memory device.

15. The circuit as claimed in claim 1, wherein the circuit is a graphic dynamic random access memory device.

16. A system comprising
a processor;
a memory; and
a circuit coupled between the processor and the memory, the circuit for creating an error coding data block for a first data block, the circuit comprising:
a first error coding path adapted to selectively create a first error coding data block in accordance with a first error coding; and
a second error coding path adapted to selectively create a second error coding data block in accordance with a second error coding;
the first error coding path and the second data path being selected as a function of a control indicator, and at least the first error coding path comprising a data arrangement alteration device.

17. The system as claimed in claim 16, wherein the memory is selected to store information of the first data block along with the error coding data block in a writing operation.

18. The system as claimed in claim 16, wherein the circuit is adapted to read out the information of the first data block along with the error coding data block in a reading operation; and
to perform, by means of the error coding data block, an error detection or error correction for read-out information of the first data block.

19. An apparatus for creating an error coding data block for a first data block, the apparatus comprising:
first means for selectively performing a first error coding so as to create a first error coding data block; and
second means for selectively performing a second error coding so as to create a second error coding data block;
the first means and the second means being selected as a function of a control indicator, and at least the first means for performing the first error coding comprising a means for performing a data arrangement alteration algorithm.

20. The apparatus as claimed in claim 19, wherein the first means for performing the first error coding and the second means for performing the second error coding are adapted to perform the same data arrangement alteration algorithm for the first and second error codings.

21. The apparatus as claimed in claim 20, wherein the first means for performing the first error coding and the second means for performing the second error coding comprise a means, shared by the two means for performing the data arrangement alteration algorithm.

22. The apparatus as claimed in claim 19, wherein the first means for performing the first error coding and the second means for performing the second error coding are adapted to perform the same error coding algorithm for the first and second error codings.

23. The apparatus as claimed in claim 22, wherein the first means for performing the first error coding and the second means for performing the second error coding comprise a means, shared by the two means for performing an error coding algorithm.

24. The apparatus as claimed in claim 19, wherein the first means for performing the first error coding comprises a first means for performing a first data arrangement alteration algorithm and a first means for performing a first error coding algorithm; and the second means for performing the second error coding comprises a second means for performing a second data arrangement alteration algorithm and a second means for performing as second error coding algorithm;
the first data arrangement alteration algorithm being different from the second data arrangement alteration algorithm; and the first error coding algorithm being different from the second error coding algorithm.

25. The apparatus as claimed in claim 19, wherein the error coding data block is selectively created by the first means for performing the first error coding or by the second means for performing the second error coding as a function of the control indicator and a second control indicator.

26. The apparatus as claimed in claim 19, wherein a means for performing a data arrangement alteration algorithm is adapted to create a second data block, comprising a given number of data in a second arrangement, on the basis of the first data block comprising the given number of data in a first arrangement, in accordance with the data arrangement alteration algorithm.

27. The apparatus as claimed in claim 19 which is adapted to receive several data at the same time.

28. The apparatus as claimed in claim 19, wherein a means for performing an error coding algorithm is adapted to perform an error detection or error correction algorithm as the error coding algorithm.

29. The apparatus as claimed in claim 19, wherein a means for performing an error coding algorithm is adapted to perform a cyclic redundancy code algorithm as the error coding algorithm.

30. The apparatus as claimed in claim 19, wherein the control indicator is dependent on an operating mode.

31. The apparatus as claimed in claim 19, wherein the apparatus is a graphic memory device.

32. The apparatus as claimed in claim 19, wherein the apparatus is a graphic dynamic random access memory device.

33. A circuit for creating an error coding data block for a first data block, the circuit comprising:
a data arrangement alteration device comprising an input and an output, the data arrangement alteration device being adapted to receive, at the input, a first data block comprising a given number of data in a first arrangement, and to create, on the basis of the first data block, a second data block comprising a given number of data in a second arrangement, and to output same at the output; and
an error coder comprising an input and an output, the input being coupled to a first control output of a controller, the input of the error coder being coupled to the output of the data arrangement alteration device, the error coder being adapted to create, on the basis of the second data block, a coding data block and to output same at the output of the error coder,
the data arrangement alteration device further comprising a control input and being adapted to create the second data block as a function of a first control indicator in accordance with a first or second data arrangement alteration algorithm, and/or the error coder further comprising a control input and being adapted to create the error coding data block as a function of the first control indicator in accordance with a first or second error coding algorithm.

34. The circuit as claimed in claim 33, wherein the data arrangement alteration device is adapted to create the second data block in accordance with the first data arrangement alteration algorithm, and the error coder is adapted to create the error coding data block in accordance with the first error coding algorithm, if the first control indicator comprises a first value, and wherein the data arrangement alteration device is adapted to create the second data block in accordance with the second data arrangement alteration algorithm, and the error coder is adapted to create the error coding data block in accordance with the second error coding algorithm, if the first control indicator comprises a second value which differs from the first value.

35. The circuit as claimed in claim 33, wherein the error coder is adapted to create the error coding data block as a function of a second control indicator in accordance with the first or second error coding algorithm.

36. The circuit as claimed in claim 33, wherein the input of the data arrangement alteration device is a parallel input which may receive several data at the same time.

37. The circuit as claimed in claim 33, wherein the error coding algorithms are error detection or error correction algorithms.

38. The circuit as claimed in claim 33, wherein the error coding algorithm is a cyclic redundancy code algorithm.

39. The circuit as claimed in claim 33, wherein the data arrangement alteration device comprises a deserializer, a programmable logic component and a multiplexer, the deserializer being adapted to convert a first data block to a parallel intermediate arrangement, so that all data of the first data block are arranged in parallel with one another.

40. The circuit as claimed in claim 33, wherein the circuit is a memory interface device.

41. The circuit as claimed in claim 40, wherein the input of the data arrangement alteration device is a parallel input which may receive several data at the same time, and the data arrangement alteration device is adapted to receive, in a burst mode, the first data block over several clock pulses.

42. The circuit as claimed in claim 33, wherein the first control indicator is provided by a control device, for example by a mode register.

43. A method of creating an error coding data block for a first data block, the method comprising:
receiving the first data block;
selectively performing a first error coding via a first path so as to create a first error coding data block;
selectively performing a second error coding via a second path so as to create a second error coding data block;
the first error coding data block for the first data block and the second error coding data block being selectively created as a function of a control indicator, wherein at least the step of selectively performing the first error coding comprises the step of performing a data arrangement alteration algorithm.

44. The method as claimed in claim 43, wherein performing the first error coding and performing the second error coding comprise performing the same data arrangement alteration algorithm.

45. The method as claimed in claim 43, wherein performing the first error coding and the second error coding comprise performing the same error coding algorithm.

46. The method as claimed in claim 43, wherein performing the first error coding comprises performing a first data arrangement alteration algorithm and performing a first error coding algorithm; and performing a second error coding comprises performing a second data arrangement alteration algorithm and performing a second error coding algorithm;
the first data arrangement alteration algorithm being different from the second data arrangement alteration algorithm; and the first error coding algorithm being different from the second error coding algorithm.

47. The method as claimed in claim 43, wherein the error coding data block for the first data block is selectively created by performing the first error coding or by performing the second error coding, as a function of a control indicator and a second control indicator.

48. The method as claimed in claim 43, wherein receiving the first data block comprises receiving several data at the same time.

49. The method as claimed in claim 43, wherein the error coding algorithm is an error detection or an error correction algorithm.

50. The method as claimed in claim 43, wherein the error coding algorithm is a cyclic redundancy code algorithm.

51. The method as claimed in claim 43, wherein the value of the control indicator depends on an operating mode.

* * * * *